(12) United States Patent
Schmitt et al.

(10) Patent No.: US 7,926,700 B2
(45) Date of Patent: Apr. 19, 2011

(54) SOLDER PASTES COMPRISING NONRESINOUS FLUXES

(75) Inventors: Wolfgang Schmitt, Rodgau (DE);
Christian Loosz, Langenselbold (DE);
Frank Breer, Mespelbrunn (DE);
Jurgen Hornung, Grundau (DE);
Thomas Krebs, Doernsteinbach (DE);
Joerg Trodler, Erlensee (DE)

(73) Assignee: W.C. Heraeus GmbH, Hanau (DE)

( * ) Notice: Subject to any disclaimer, the term of this patent is extended or adjusted under 35 U.S.C. 154(b) by 43 days.

(21) Appl. No.: 12/093,033

(22) PCT Filed: Oct. 20, 2006

(86) PCT No.: PCT/EP2006/010139
§ 371 (c)(1),
(2), (4) Date: Nov. 25, 2008

(87) PCT Pub. No.: WO2007/054198
PCT Pub. Date: May 18, 2007

(65) Prior Publication Data
US 2009/0152331 A1    Jun. 18, 2009

(30) Foreign Application Priority Data
Nov. 8, 2005  (DE) .......................... 10 2005 053 553

(51) Int. Cl.
*B23K 31/02* (2006.01)
*B23K 35/00* (2006.01)
*H01L 21/44* (2006.01)
(52) U.S. Cl. .......... 228/248.1; 148/23; 148/24; 438/613
(58) Field of Classification Search .................. None
See application file for complete search history.

(56) References Cited

U.S. PATENT DOCUMENTS

| | | | | | |
|---|---|---|---|---|---|
| 3,895,973 | A | * | 7/1975 | Stayner | 148/25 |
| 3,960,613 | A | * | 6/1976 | Stayner | 148/23 |
| 4,218,248 | A | * | 8/1980 | Snyder et al. | 106/1.12 |

(Continued)

FOREIGN PATENT DOCUMENTS

DE        841 097         6/1952

(Continued)

OTHER PUBLICATIONS

"Gelieren", http://www.roempp.com/prod/roempp.php.

(Continued)

*Primary Examiner* — Kiley Stoner
(74) *Attorney, Agent, or Firm* — Panitch Schwarze Belisario & Nadel LLP

(57) ABSTRACT

According to the invention, a resin-free solder paste made from a metal powder, particularly soft solder and a gel, is prepared, wherein the gel according to the invention leaves no residue on the metal surface during the remelting of the metal powder. The gel according to the invention is based on a mixture that is stable during storage and that comprises carboxylic acid(s), amine(s), and solvent(s). Important uses are the application of soft solder pastes on power-modules, die-attach, chip-on-board, SiP (System-in-Package), for wafer-bumping, particularly on UBM's (Under-Bump-Metallization), and SMT (Surface Mounted Technology), particularly coated circuits. With the use of resin-free soft solder pastes according to the invention, cleaning is eliminated before a protective coating process after the soldering of an electrical connection, and the formation of pores in solder bumps deposited on UBM's is reduced to less than 20 vol. %.

12 Claims, 13 Drawing Sheets

U.S. PATENT DOCUMENTS

| | | | | |
|---|---|---|---|---|
| 4,342,607 A * | 8/1982 | Zado | | 148/23 |
| 4,960,236 A * | 10/1990 | Hedges et al. | | 228/180.1 |
| 5,011,546 A * | 4/1991 | Frazier et al. | | 148/23 |
| 5,064,482 A * | 11/1991 | Goobich et al. | | 148/24 |
| 5,196,070 A * | 3/1993 | Ables et al. | | 148/23 |
| 5,641,890 A * | 6/1997 | Wesley et al. | | 44/266 |
| 6,174,353 B1 * | 1/2001 | Yuan et al. | | 106/1.11 |
| 6,372,077 B1 * | 4/2002 | Tecle | | 156/279 |
| 6,592,020 B1 * | 7/2003 | Currie et al. | | 228/224 |
| 6,796,482 B2 * | 9/2004 | Wetz et al. | | 228/207 |
| 6,881,776 B2 * | 4/2005 | Butuc | | 524/284 |
| 7,413,771 B2 * | 8/2008 | Arora et al. | | 427/216 |
| 7,494,962 B2 * | 2/2009 | Kin et al. | | 510/175 |
| 7,579,308 B2 * | 8/2009 | Lee | | 510/175 |
| 2001/0045244 A1 * | 11/2001 | Akaike et al. | | 148/25 |
| 2003/0221748 A1 * | 12/2003 | Arzadon et al. | | 148/23 |
| 2004/0000355 A1 * | 1/2004 | Suga et al. | | 148/25 |
| 2004/0016794 A1 * | 1/2004 | Gosselin et al. | | 228/209 |
| 2004/0020562 A1 * | 2/2004 | Wetz et al. | | 148/23 |
| 2004/0074952 A1 * | 4/2004 | Stipp et al. | | 228/245 |
| 2004/0129344 A1 * | 7/2004 | Arita et al. | | 148/23 |
| 2004/0165362 A1 * | 8/2004 | Farnworth | | 361/764 |
| 2004/0234460 A1 * | 11/2004 | Tarver et al. | | 424/49 |
| 2005/0004288 A1 * | 1/2005 | Koyanagi et al. | | 524/274 |
| 2005/0023328 A1 * | 2/2005 | Stipp et al. | | 228/207 |
| 2005/0048584 A1 * | 3/2005 | Gosselin et al. | | 438/584 |
| 2005/0100735 A1 * | 5/2005 | Arora et al. | | 428/403 |
| 2005/0218195 A1 * | 10/2005 | Wilson et al. | | 228/180.22 |
| 2006/0006890 A1 * | 1/2006 | Karavakis et al. | | 324/754 |
| 2006/0011267 A1 * | 1/2006 | Kay et al. | | 148/23 |
| 2006/0011703 A1 * | 1/2006 | Arita et al. | | 228/56.3 |
| 2006/0115970 A1 * | 6/2006 | Lee | | 438/584 |
| 2006/0151580 A1 * | 7/2006 | Flint | | 228/244 |
| 2006/0180245 A1 * | 8/2006 | Wicker et al. | | 148/23 |
| 2007/0051774 A1 * | 3/2007 | Stipp et al. | | 228/101 |
| 2007/0120921 A1 * | 5/2007 | Carlini et al. | | 347/100 |
| 2008/0066830 A1 * | 3/2008 | Gunji et al. | | 148/23 |
| 2008/0135133 A1 * | 6/2008 | Hagiwara | | 148/23 |
| 2008/0156852 A1 * | 7/2008 | Prakash | | 228/256 |
| 2008/0299394 A1 * | 12/2008 | Arora et al. | | 428/407 |
| 2008/0305341 A1 * | 12/2008 | Plieth et al. | | 428/419 |
| 2009/0082518 A1 * | 3/2009 | Uchida et al. | | 524/539 |

FOREIGN PATENT DOCUMENTS

| | | |
|---|---|---|
| DE | 2 231 299 | 1/1973 |
| DE | 15 08 333 C3 | 1/1975 |
| DE | 29 91 827 A1 | 12/1980 |
| DE | 41 19 012 C1 | 12/1992 |
| DE | 695 24 421 T2 | 5/2002 |
| DE | 103 21 583 A1 | 12/2004 |
| JP | 1-154897 A | 6/1989 |

OTHER PUBLICATIONS

"Polykondensation", http://www.roempp.com/prod/roempp.php.

* cited by examiner

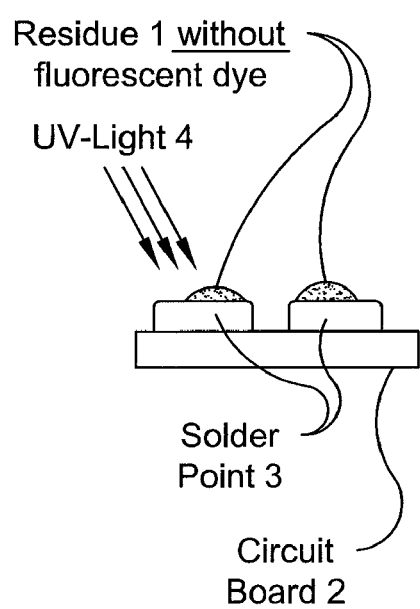 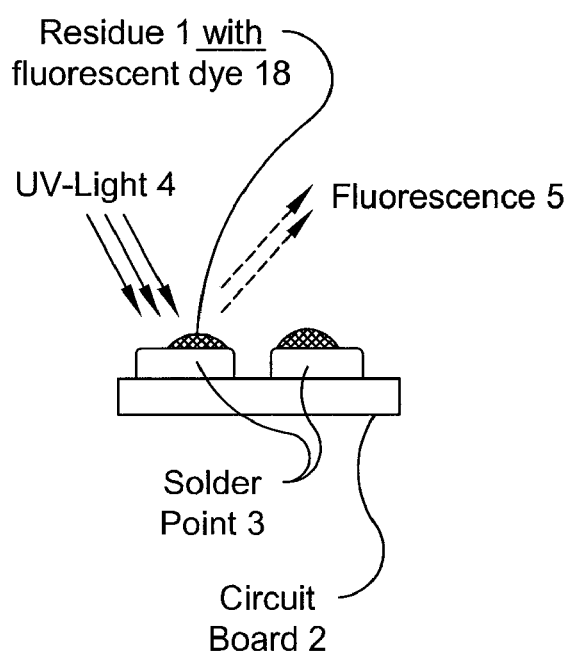
*Fig. 1c*  *Fig. 1d*

Frequency distribution of the pore volume fraction of wafer 1

Scatter plot of wafer 1

| | Median value | Standard deviation | Min. | Max. |
|---|---|---|---|---|
| Total | 3.98 | 2.27 | 0 | 13.6 |
| MG1 | 3.92 | 1.87 | 0.4 | 9.8 |
| MG2 | 3.86 | 2.28 | 0.6 | 13.5 |
| MG3 | 3.15 | 2.29 | 0 | 10.8 |
| MG4 | 3.25 | 1.70 | 0 | 7.5 |
| MG5 | 4.46 | 2.54 | 0.5 | 11.5 |
| MG6 | 3.15 | 1.95 | 0 | 7.8 |
| MG7 | 4.54 | 2.12 | 0.6 | 11.1 |
| MG8 | 4.91 | 2.42 | 0.5 | 13.6 |
| MG9 | 4.53 | 2.38 | 0.2 | 11.6 |

Table 1

| | Median value | Standard deviation | Min. | Max. |
|---|---|---|---|---|
| Total | 5.75 | 8.45 | 0 | 39.2 |
| MG1 | 6.59 | 9.12 | 0 | 36 |
| MG2 | 5.39 | 8.70 | 0 | 39.2 |
| MG3 | 3.91 | 6.81 | 0 | 28.9 |
| MG4 | 7.93 | 10.03 | 0 | 38 |
| MG5 | 5.92 | 7.33 | 0 | 27.1 |
| MG6 | 4.42 | 8.08 | 0 | 36 |
| MG7 | 6.94 | 9.31 | 0 | 36.2 |
| MG8 | 5.00 | 7.75 | 0 | 34.7 |
| MG9 | 5.65 | 7.90 | 0 | 37.3 |

*Table 2*

|  | Median value | Standard deviation | Min. | Max. |
|---|---|---|---|---|
| Total | 6.04 | 8.85 | 0 | 44.7 |
| MG1 | 6.68 | 8.80 | 0 | 35.2 |
| MG2 | 6.55 | 10.14 | 0 | 37.4 |
| MG3 | 4.93 | 8.68 | 0 | 33.7 |
| MG4 | 7.22 | 10.05 | 0 | 41.2 |
| MG5 | 3.43 | 5.24 | 0 | 25.8 |
| MG6 | 7.20 | 9.85 | 0 | 44.7 |
| MG7 | 5.81 | 8.68 | 0 | 39.6 |
| MG8 | 6.79 | 8.69 | 0 | 30.6 |
| MG9 | 5.81 | 8.16 | 0 | 34.1 |

*Table 3*

SOLDER PASTES COMPRISING NONRESINOUS FLUXES

CROSS-REFERENCE TO RELATED APPLICATIONS

This application is a Section 371 of International Application No. PCT/EP2006/010139, filed Nov. 8, 2005 which was published in the German language on Mar. 18, 2007, under International Publication No. WO 2007/054198 A2 and the disclosure of which is incorporated herein by reference.

BACKGROUND OF THE INVENTION

The present invention relates to a novel gel comprising a mixture of carboxylic acid, amine, and solvent; a paste, in particular soft solder paste, in which the metallic component is dispersed as a powder in the gel; and the application of soft solder pastes on UBM's (Under Bump Metallization); and the use of these soft solder pastes for power-modules, die-attach, chip-on-board, system-in-package (SiP), wafer-bumping, or SMT (Surface Mounted Technology), particularly coated circuits.

German Patent DE 841 097 discloses soldering agents, in which the amine is condensed with the carboxylic acid to ureides. According to DE 841 097, it is taken into account that carboxylic acids and amines are present in mixtures. However, it is referenced that they enter into chemical compounds with each other and form, e.g., ureides.

German Patent DE 41 19 012 describes a soft solder paste, which can be washed out with water, comprising a soft solder powder, a bonding agent-flux agent mixture made of water-soluble salts of fatty amines with carboxylic acid and solvent.

BRIEF SUMMARY OF THE INVENTION

An object of the present invention is to minimize the formation of residue at the solder points.

Furthermore, voids according to "Wafer Bumping: Is the Industry Ready?" (Greg Reed, Reed Media Services, Gurnee, Ill.—Oct. 1, 2004—*Semiconductor International*) are not only generally undesired, but there is also the desire to keep the maximum void formation of all solder points small. To this end, an object according to the invention is to reduce the maximum void formation to less than 20 vol. %, preferably less than 15 vol. %. Furthermore, it is desirable to guarantee bumps that are as coplanar as possible, which is why a problem is also stated in this respect.

According to embodiments of the invention, carboxylic acids and amines are gelled with a polar solvent, whereby a salt formation or a chemical reaction of the carboxylic acids with the amines is suppressed.

According to embodiments of the invention, a resin-free solder paste is prepared from a metal powder, in particular soft solder and a gel, wherein the gel according to embodiments of the invention leaves no residues on the metal surface when the metal powder is remelted. The gel according to embodiments of the invention is based on a mixture that is stable during storage comprising carboxylic acid(s), amine(s), and solvent(s). Important uses are the application of soft solder pastes on power-modules, die-attach, chip-on-board, SiP (System-in-Package), for wafer-bumping, particularly on UBM's (Under-Bump-Metallization), and SMT (Surface Mounted Technology), particularly coated circuits. The use of resin-free soft solder pastes according to embodiments of the invention eliminates cleaning before protective coating after the soldering of an electrical connection and reduces the formation of pores in solder bumps deposited on UBM's to under 20 vol. %.

In gels according to embodiments of the invention, the carboxylic acids and amines are dissolved. The main components therefore produce a gelled solution comprising amines, carboxylic acids, and solvents. The carboxylic acid component comprises at least one carboxylic acid and is, in particular, a mixture of different carboxylic acids. The amine component comprises at least one amine and is, in particular, a mixture of amines. The solvent component comprises at least one solvent, in particular an organic solvent mixture.

For preventing reactions of carboxylic acids with the amines, lower temperatures are preferred, e.g., room temperature, and the components are mixed with each other as quickly as possible. The gelling is therefore performed completely on the basis of secondary valences, in particular hydrogen bridges. In the solution or the gel additional materials, e.g., thickeners, can be dispersed.

In this way, it becomes possible according to embodiments of the invention to avoid fluxing agent residue after soldering the soft solder pastes. This is associated with an enormous simplification in processing, primarily for applications of solder pastes, in which solder points must be cleaned of residue. Until now, the costs for cleaning could definitely exceed the costs for the paste. In particular, methods in which additional processes follow the soldering process are simplified. For example, later bonding or later electrical testing with needle testers becomes more reliable and simpler. For coated circuits the previously necessary coating compatibility with fluxing agent residues is eliminated.

According to embodiments of the invention, methods for the fields of power-modules, die-attach, wafer-bumping, system-in-package, DRAM (Dynamic Random Access Memory), and automobiles are simplified and qualitatively improved. Accompanying this, the economic balance is also improved, in that rejects are reduced or enormous cleaning expense and thus the consumption of cleaning agents is eliminated.

In the scope of the present invention it was recognized that resin, in particular colophonium-based pastes, change their composition with respect to metal content relative to fluxing agent during application on UBM's, in particular with a doctor blade, which the inventors see as at least one cause for the high standard deviation with respect to void formation and suspect a relationship between the maximum voids of 30 vol. % and above and the non-homogeneous compositions. Furthermore, the solids content of lead-free soft solder pastes is limited to less than 90 wt. %.

In the production of wafer bumps, one approach to a solution refers to the fact that the solder powder is dispersed in a gel. A paste made from the soft solder powder dispersed in the gel comprises soft solder powder to greater than 90 wt. %, preferably to greater than 91 wt. %. The volume proportion of soft solder powder and the paste equals greater than 55 vol. %, preferably greater than 60 vol. %.

The use of the fluxing agent according to embodiments of the invention is not limited to soft solders. The gel that can be processed quickly into paste is also suitable for the production of other pastes. The fluxing agent according to embodiments of the invention can also be used as a gel or lubricant.

According to embodiments of the invention, gels can be produced, which are stable during storage and can be removed at temperatures between 150° C. and 250° C. The storage stability imparts to the gels or the pastes produced from the gels a simple handling between the production of the gels and their use. Here, an important feature is that the gel state is maintained for months. Advantageously, the consistency of the gel remains essentially unchanged during typical storage conditions.

The main components of the gels are carboxylic acids, amines, and solvents, which can be easily removed by thermal processes. These components volatize or decompose between 150 and 250° C. leaving essentially no residue. Auxiliary products can be added. To a lesser degree, such additives have proven effective for setting the rheology. Dyes are preferably added in the ppm range. Furthermore, proven additives are decomposition catalysts, e.g., peroxides or activators, e.g., halogen activators, particularly ammonium chloride.

In preferred embodiments:
  the gel can decompose in a thermal process leaving no residue or almost no residue,
  the gel is similar to resin with respect to viscosity and adhesiveness, for example to colophonium,
  the solvent stabilizes the gel state,
  the solvent suppresses chemical reactions between carboxylic acid and amine,
  the polar solvent forms hydrogen bridges,
  the polar solvent contains a polyol, for example glycol or glycerin,
  the carboxylic acids are used for dissolving or removing metal oxides, particularly tin oxides on the soft solder powder,
  the activators are used for dissolving or removing metal oxides, particularly tin oxides on the soft solder powder,
  the carboxylic acids are easily decomposable,
  the carboxylic acids are multi-functional, for example, citric acid, adipic acid, cinnamic acid, and benzylic acid,
  the carboxylic acids have 2 to 50 C atoms and up to two aromatic rings,
  the amines are tertiary,
  the amines have 6 to 100 C atoms,
  the weight percentage of the carboxylic acid is higher than the weight percentage of the amine.

According to embodiments of the invention, resin-free solder pastes can be prepared. Thus, according to embodiments of the invention, resin residue can be eliminated. The matrix material for the solder powder according to embodiments of the invention can be essentially broken down thermally.

The gel can be set with respect to its consistency using 1 to 5 wt. % thickener. Preferred thickeners can likewise be broken down thermally. If a wax that cannot break down completely is used as the thickener, nevertheless essentially residue-free solder pastes can be prepared, whose residue can be set to less than 1 wt. %. Polyamides or amorphous silicic acid are also suitable as the thickener. Amorphous silicic acid is deposited loosely on the surface of the soldering point during the soldering process. Here, traces of contaminants remain bonded to the silicic acid and can be simply polished away with the silicic acid without the use of solvents.

For further processing the gel into the soft solder paste, gel and metal powder are mixed in approximately the same volumes. Here, especially fine metal powder and bimodal or multimodal metal powder have proven effective, especially for uses without additional thickener. Embodiments of the present invention now allow the metal powder to be dispersed in the gel directly after the production of the gel. The previously typical waiting time before introducing the metal powder into the fluxing agent is eliminated.

Solder pastes comprising 40 to 60 volume % fluxing agent and 40 to 60 vol. % soft solder powder have proven effective.

In an inventive embodiment a dye is added to the gel. Pastes with 10 to 200 ppm phthalocyanine have proven effective.

This corresponds to 0.1 to 2% phthalocyanine in the fluxing agent or gel. Preferably, the dyes are insoluble in metals and decompose in the absence of an organic matrix. Phthalocyanines adequately satisfy these requirements. Also, fluorescent dyes are very suitable. For example, with 1 ppm fluorescent dye in a paste, remaining paste residue could be visualized. Especially suitable are fluorescent dyes, which are stabilized by the gel matrix and decompose thermally without stabilization. In this way, very low residue amounts can be indicated. Thus, first, the quality is controlable and, second, it is possible to selectively eliminate even very low residue amounts. Dyes or fluorescent pigments with decomposition temperatures between 150 and 250° C. have proven effective.

Embodiments of the present invention are especially valuable for all uses, which previously required cleaning after the soldering process. The uses of solder pastes in the fields of power-modules, die-attach, or chip-on-board, shall be emphasized. In these uses, after soldering a component for mechanical attachment, a bonding process for making electrical contact is performed. Residues deposited on the bonding surfaces by the remelting process of the solder paste make bonding impossible or at least considerably more difficult. Therefore, it is important for the bonding process that no fluxing agent residue is present on the bonding surfaces. According to embodiments of the invention, now a bonding process without a prior cleaning process is enabled.

Another important use of gels according to embodiments of the invention and corresponding soft solder pastes relates to the coating of circuits. Protective coatings are used, in addition to their protective function from environmental influences, for electrical isolation. The previously required compatibility of coating and residue is eliminated in the residue-free or low-residue solder pastes according to embodiments of the invention.

For the application of soft solder pastes on UBM's (Under-Bump-Metallization), the gel forming the basis of the soft solder paste is preferably based on a polar solvent component, particularly a water-soluble solvent and a thickener based on an amine or carboxylic acid component.

Preferably, the proportion of soft solder paste to auxiliary product (gelled solvent) equals 5-40 vol. %. For this purpose, polar solvents, such as glycerin, glycol, tridecyl alcohol, and terpineol have proven effective. A plurality of polyols is suitable for the purpose as a solvent due to their good storage properties and high viscosity for the use of solvent according to embodiments of the present invention. Other polar solvents known from fat production with high viscosity and good carrying behavior can also be used as solvents for the purpose of embodiments of the present invention. Here, the rheological properties of the solvent can be set by the mixture of different solvents. The viscosity of the solvent, however, is significantly less in comparison with the viscosity of resin, for example colophonium, so that, with respect to pastes with comparable metal powder, a reduction in viscosity is provided relative to pastes with resin-type fluxing agent. For the same viscosity, the soft solder powder proportion of the paste is increased relative to pastes with resin-type fluxing agent. While for pastes with resin-type fluxing agent the proportion of soft solder powder equals between 87 and 88.5 wt. % and an application with 90 wt. % on a wafer with photoresist would fail at the too high viscosity of the paste, according to embodiments of the invention a soft solder powder proportion of greater than 90 wt. %, particularly greater than 91 wt. %, is reached by pastes, whose fluxing agent is based on a polar solvent, particularly through gelling with polar solvents.

The carboxylic acid component has the function of dissolving oxide skins on the metal surfaces to be soldered. Therefore, care is to be taken that the metal oxide-dissolving function of the carboxylic acid component is not significantly broken down by the presence of the other paste components. In particular, reactions with the amine component to form salts or carboxylic acid amides are to be avoided. The amine component has an activation function, whereby care is to be taken that this activation function is not lost through reaction with other components of the soft solder paste, particularly their carboxylic acid component.

All known soft solder powders can be used according to embodiments of the invention, for example on the basis of tin, lead, bismuth, indium, gold, or silver.

The soft solder powder preferably contains tin, particularly greater than 50 wt. %, and optionally greater than 90 wt. %. Silver and copper are suitable alloy components. The classic tin-lead solder as well as high lead content solders are similarly applicable according to the invention.

Powder types smaller than 38 μm, particularly smaller than 25 μm, corresponding to type 4, 5, 6 and smaller according to ANSI/J-STD-005 or DIN/EN 61190, are preferred.

An accompanying use solution comprises a plurality of UBM's, which are coated with soft solder paste, wherein the soft solder paste per UBM has 60-90 vol. % soft solder powder, 10-40 vol. % polar solvent, 0-20 vol. % tertiary amine, and 0-20 vol. % carboxylic acid. In preferred embodiments:
 the soft solder powder equals greater than 70 vol. %;
 the sum of the volume of amine component and the carboxylic acid component equals 10-20 vol. %;
 the polar solvent equals 20-30 vol. %.

In particular, the polar solvent is the main component of the fluxing agent, thus, of the gel forming the basis of the paste. According to embodiments of the invention, the void formation is guaranteed by the application of the soft solder paste, first, by the high volume percentage of soft solder powder to the paste, and the essentially constant composition of the paste during the application is guaranteed by the plurality of solder deposits, particularly on UBM's. The homogeneity in the stability of the composition is essentially maintained under the typical processing conditions, in such a way that after the remelting of the soft solder paste at a confidence level of 3 sigma, particularly 4 sigma, the generated voids are limited to a maximum of 20 vol. %, preferably to a maximum of 15 vol. %.

It is assumed that the good carrying properties and the high viscosity of the solvent have an advantageous effect on the stability of pastes with high content of soft solder powder. Surprisingly, with the polar solvents, a reaction between the amine component and the carboxylic component is avoided, so that the soft solder paste used according to embodiments of the invention is stable in storage. Preferably, the solder paste contains only minimal or at best absolutely no reaction products of the carboxylic acid with the amine.

Furthermore, the paste advantageously consists of a gel, in which the soft solder powder is dispersed, particularly comprising a low-resin or resin-free gel. In the distribution of a paste with a gel as the fluxing agent using a doctor blade, the composition of the paste remains constant, in contrast to pastes with resin-type fluxing agents, and for a uniform application of the paste, a uniform solder powder distribution is realized over the plurality of UBM's. This enables the provision of especially coplanar bumps and reduces the formation of large voids.

UBM's are metallic, non-contiguous connection surfaces on the wafer surface, which are provided for a coating with, among other things, solder. On a wafer disk, a plurality of UBM's are arranged, whereupon, after partitioning the wafer disk into chips, the solders arranged on the UBM's are provided for the conventional connection of the chips. A preferred method for applying the soft solder paste on UBM's consists in that the solder paste is applied by printing technology, particularly with a doctor blade, on a photoresist, or by a template. Another method consists in non-contact application of the soft solder paste on the UBM's with a suitable dispenser, for example in jet technology.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings:

FIG. 1c is a schematic side view showing soldering points without fluorescent dye;

FIG. 1d is a schematic side view showing soldering points with fluorescent dye;

DETAILED DESCRIPTION OF THE INVENTION

Example 1

Figure 1A:
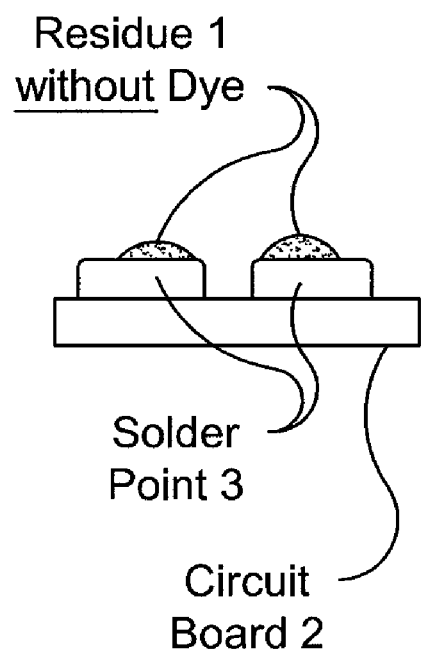
FIG. 1a is a schematic side view showing soldering points without dye.

In a container, 67 wt. % tridecyl alcohol, 20 wt. % cinnamic acid, 10 wt. % of a tertiary $C_{16}$ amine fraction, and 3% wax are stirred at room temperature until a gel-like state is reached.

Then, the gel is further processed with solder powder to form a solder paste according to the established method. The gel requires no additional holding time before processing with the solder powder.

Example 2

In a container, 67 wt. % tridecyl alcohol, 20 wt. % cinnamic acid, 10 wt. % of a tertiary $C_{16}$ alkyl amine fraction, 3% ricinoleic ester, and 0.01 wt. % phthalocyanine (Hostatint green GG 30) are stirred at room temperature until a gel-like state is reached. Then, the gel is further processed with solder powder to form a solder paste according to the established method. The gel requires no additional holding time before processing with the solder powder.

Example 3

In a container, 53 wt. % tridecyl alcohol, 14 wt. % terpineol, 10 wt. % of a tertiary $C_{12}$ alkyl amine fraction, 20 wt. % sebacic acid, and 3% ricinoleic acid are stirred at room temperature until a gel-like state is reached. Then, the gel is further processed to form a solder paste according to the established method. The gel requires no additional holding time before processing with the solder powder.

Example 4

In a container 67, wt. % glycerin, 7 wt. % cinnamic acid, 18 wt. % of a tertiary $C_{18}$ alkyl amine fraction, 5 wt. % adipic acid, 3% ricinoleic ester, and 10 ppm fluorescent dye (fluorescent pigment Z-17-N from the Dayglo Company) are stirred at room temperature until a gel-like state is reached. Then, the gel is further processed with solder powder to form a solder paste according to the established method. The gel requires no additional holding time before processing with the solder powder.

Example 5

In a container, 25.5 wt. % tridecyl alcohol, 25 wt. % terpineol, 10 wt. % tertiary alkyl amine ($C_{18}$ fraction), 30 wt. % sebacic acid, 8 wt. % benzylic acid, and 1.5 wt. % adipic acid are stirred at room temperature until a gel-like state is reached. Then, the gel is further processed without additional waiting time with 90.5 wt. % solder powder Sn63Pb37 with a range of grain sizes from 5 to 15 μm to form a solder paste according to established method. The total paste production takes place within 20 minutes. In this way, an excellent paste can be achieved without additional thickeners. Residues could not be detected and lie at least below 0.1 wt. %.

Example 6

In a container, 37.5 wt. % tridecyl alcohol, 28 wt. % terpineol, 10 wt. % 2-ethyl-4-menthyl imidazole, 15 wt. % sebacic acid, 8 wt. % benzylic acid, and 1.5 wt. % adipic acid are stirred at room temperature until a gel-like state is reached. In this way, an excellent gel formation can be achieved without additional thickeners. Then, the gel is further processed with solder powder to form a solder paste according to the established method. The gel requires no additional holding time before the processing with the solder powder and is ready for use within 20 minutes. Residues after the remelting process could not be detected and lie at least below 0.1 wt. %.

Figure 1B:
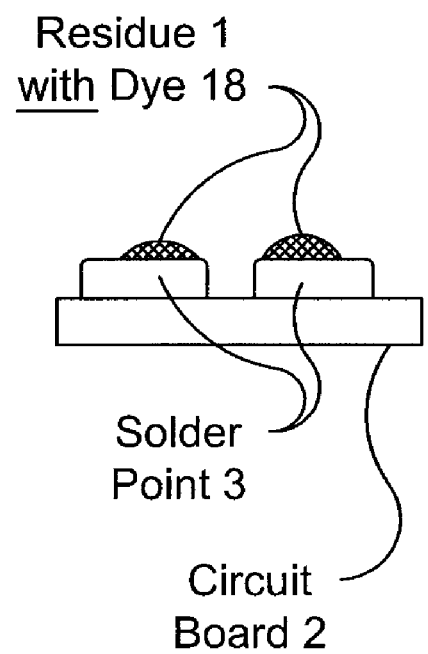
FIG. 1b is a schematic side view showing soldering points, in which very minimal residue is made visible with phthalocyanine.

FIGS. 1a and 1c show residues 1 of soldering points 3 arranged on a printed circuit board 2. FIGS. 1b and 1d show soldering points of dyed fluxing agent, in which the dyes 18 are stable only in the residue. The gels produced according to one of Examples 1 to 6 are each mixed with the same volume of solder powder to form a solder paste. According to conventional use of the solder pastes, the residue 1 of each equaled less than 1 wt. %. The residue 1 of pastes according to Example 2 is illustrated in FIG. 1b. The residue 1 of pastes according to Example 4 is illustrated in FIG. 1d. In FIG. 1d, an illustration of a soldering point is abstracted, wherein fluorescence 5 is initiated by the application of UV light 4, which illustrates improved recognition relative to FIG. 1c. This allows automatic detection of extremely small residue amounts 1. The bonding machine can be controlled so that the bonding wire is placed and bonded only on clean surfaces.

Figure 2A:
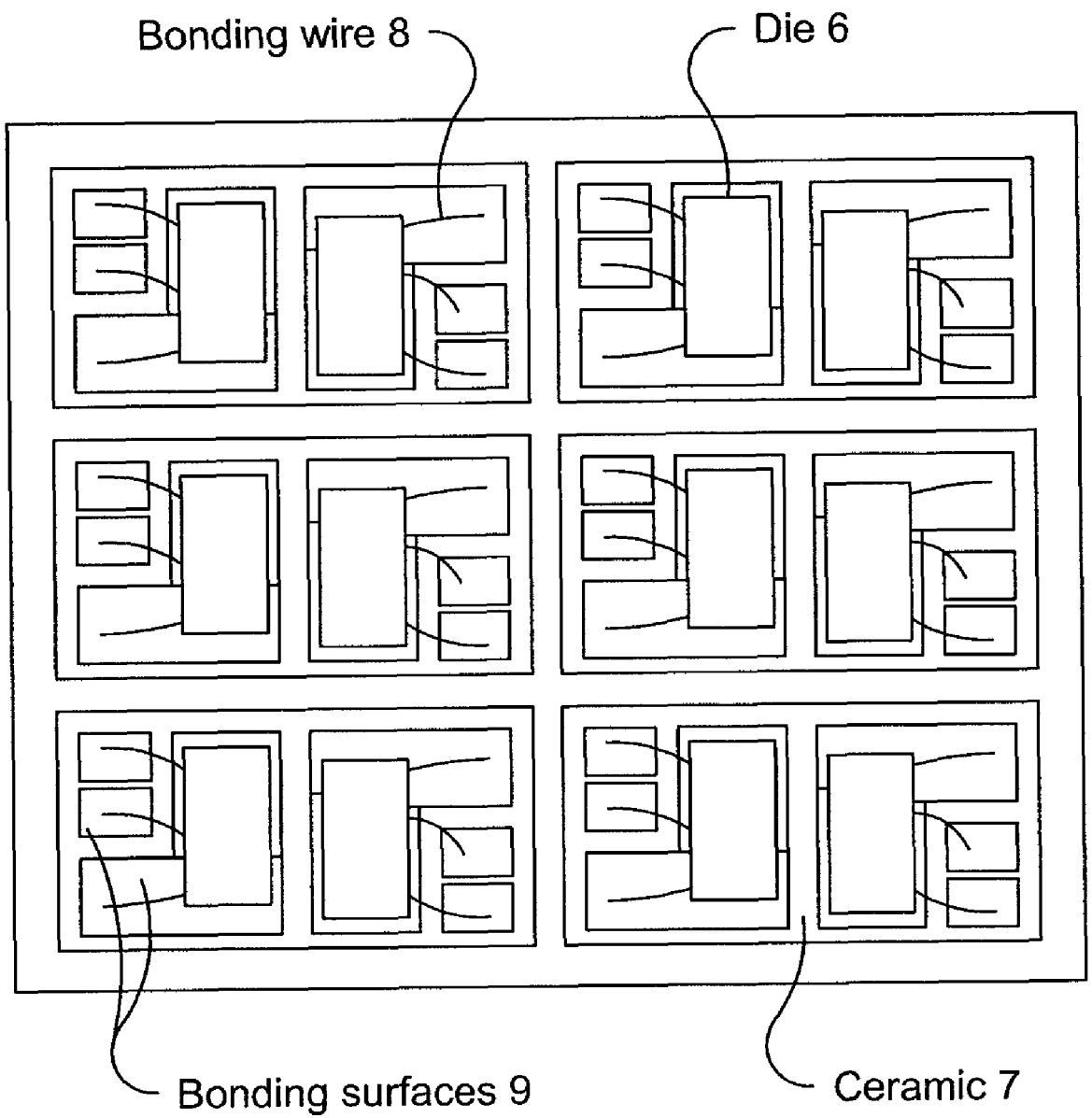
FIG. 2a is a schematic plan view of a power module, in an enlarged detail, with associated bonding surfaces.
Figure 2B:
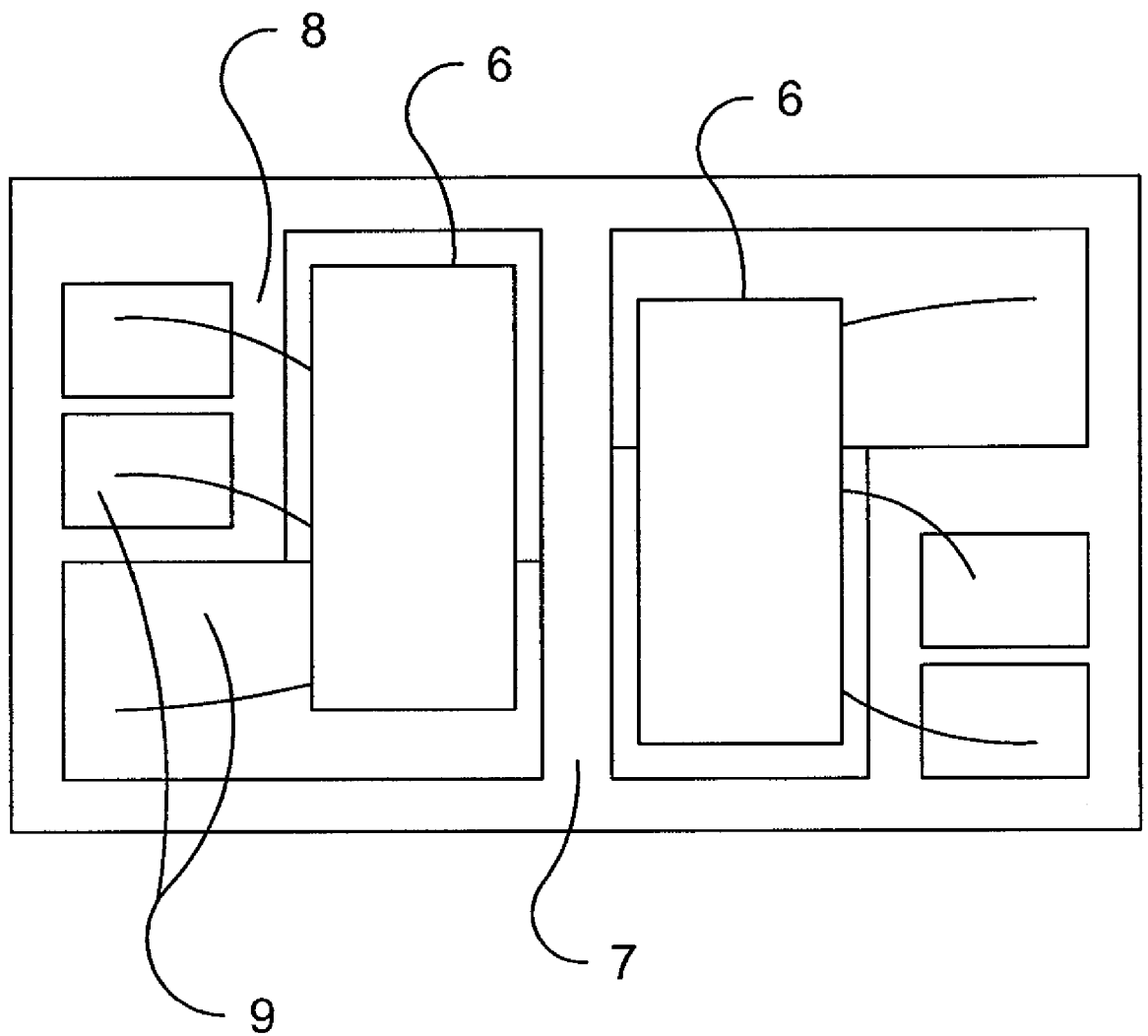
FIG. 2b is a schematic plan view of a power module, in an enlarged detail, with associated bonding surfaces.
Figure 2C:
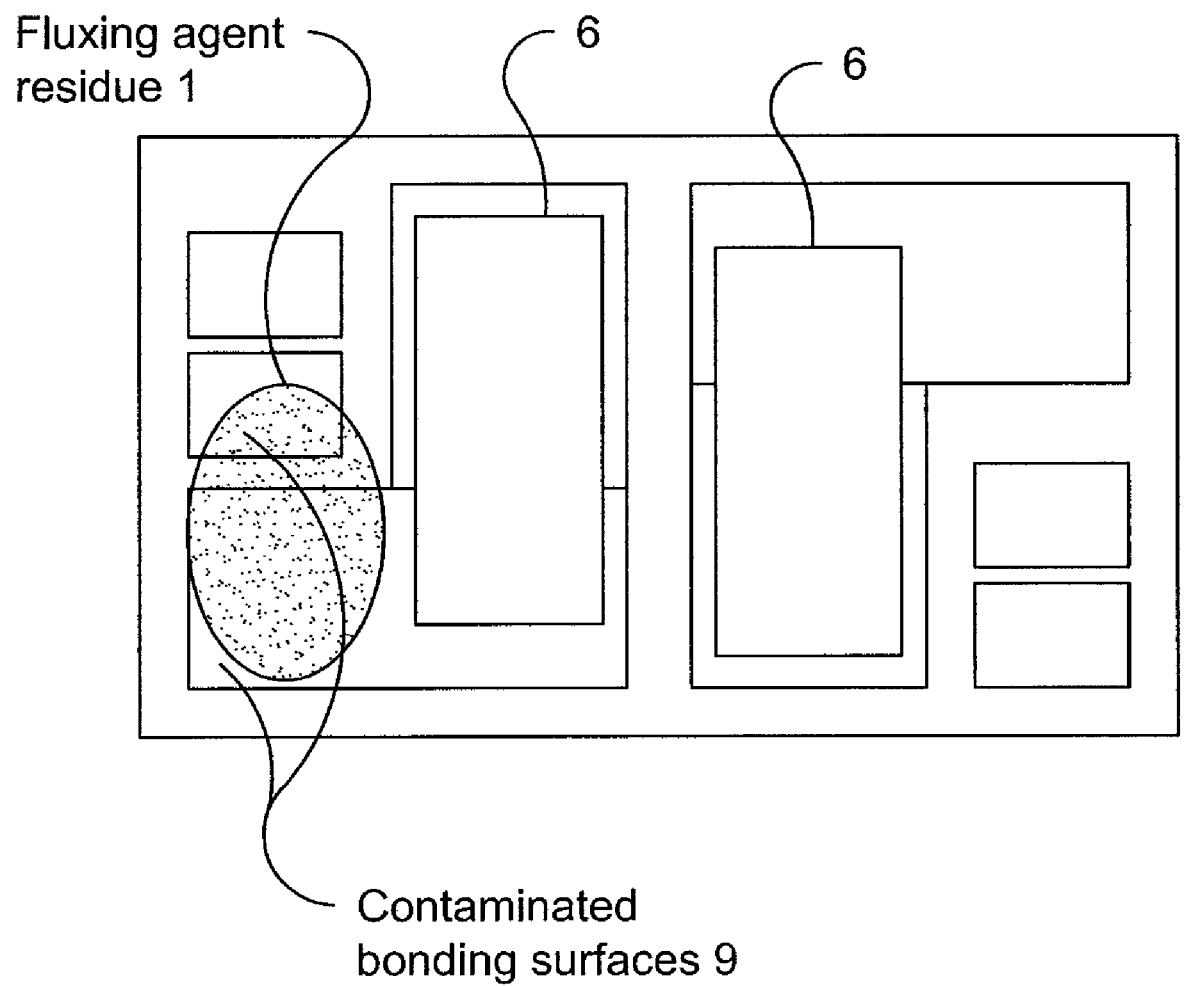
FIG. 2c is a schematic plan view of a power module, in an enlarged detail, where bonding surfaces are contaminated.

FIG. 2a shows a power module, in which, on a ceramic plate 7, several dies 6 are connected via bonding wires 8 to bonding surfaces 9. FIG. 2b shows the enlarged bonding surfaces of a power module, which was not contaminated by residue 1 from the solder paste (FIG. 2c) for conventional use of a paste produced according to one of Examples 1 to 5 in the mounting of a component, as is this case in the known solder pastes according to FIG. 2c. Therefore, the components can be bonded after their mounting, without cleaning of the bonding surfaces, because solder paste residue can be prevented according to embodiments of the invention, and the bonding surfaces are therefore not contaminated according to embodiments of the invention.

FIG. 3 shows coated circuits.

Figure 3A:
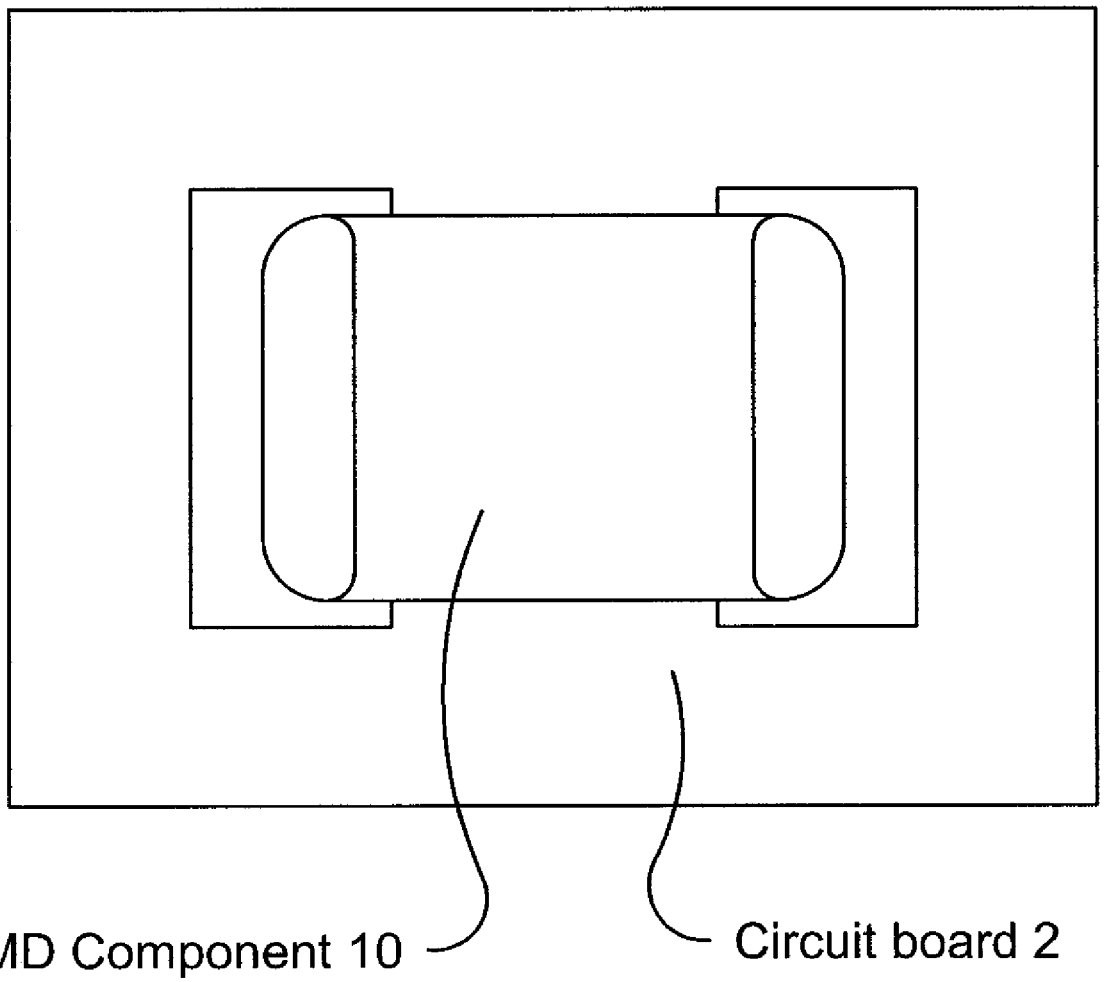
FIG. 3a is a schematic plan view of a SMD component mounted on a circuit board with no residue present according to an embodiment of the invention.

FIG. 3a shows a circuit according to embodiments of the invention, in which the soldered component is enlarged and no residue is visible in the region of the soldered component.

Figure 3B:
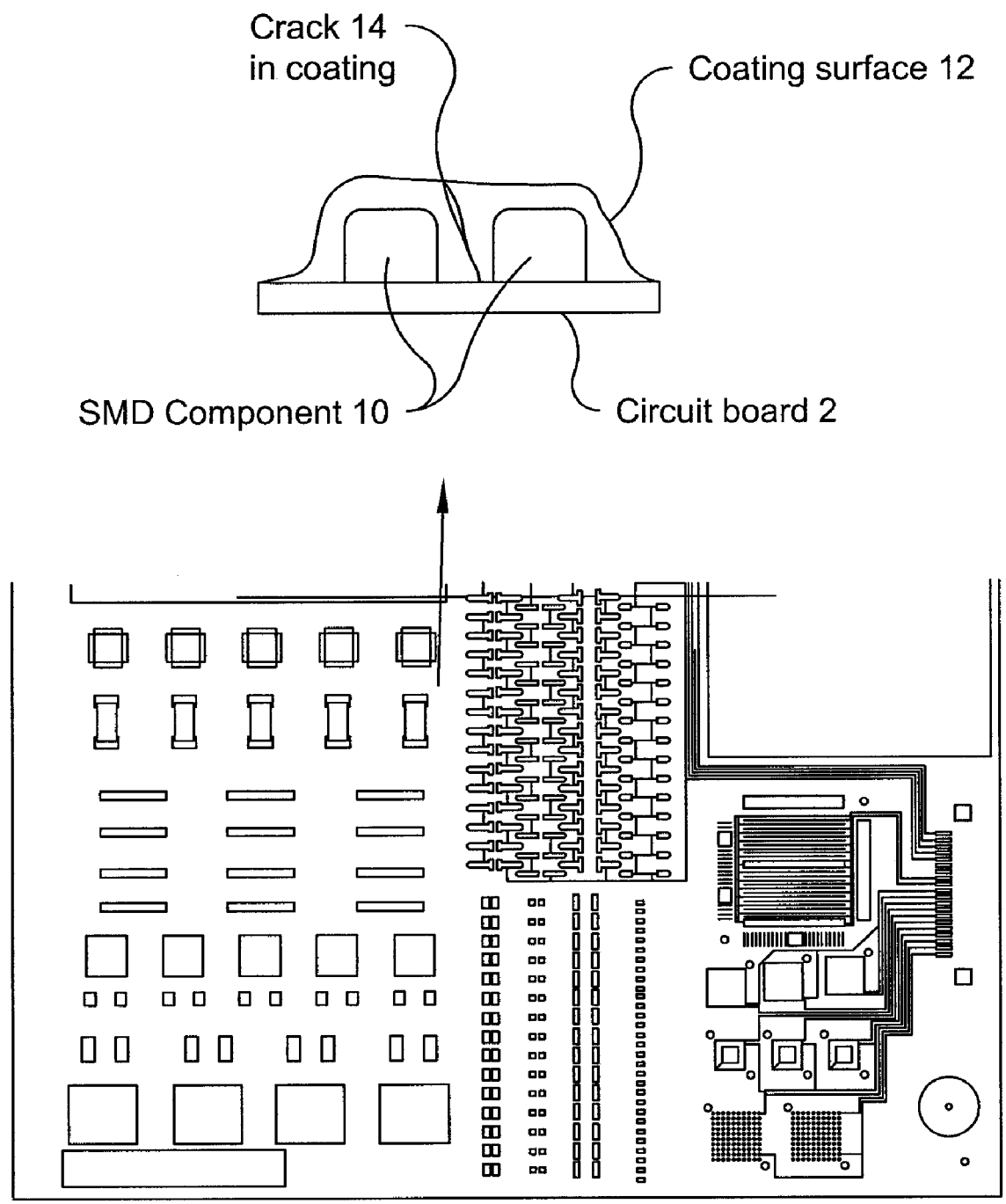
FIG. 3b is a schematic side plan view of a coated circuit of the prior art with enlarged SMD components showing a crack in the coating between components.

FIG. 3b shows a coated circuit, from which SMD components 10 are enlarged, and the coating 12 located between the components 10 has a crack 14, which was caused by solder residue in the prior art.

Figure 4:
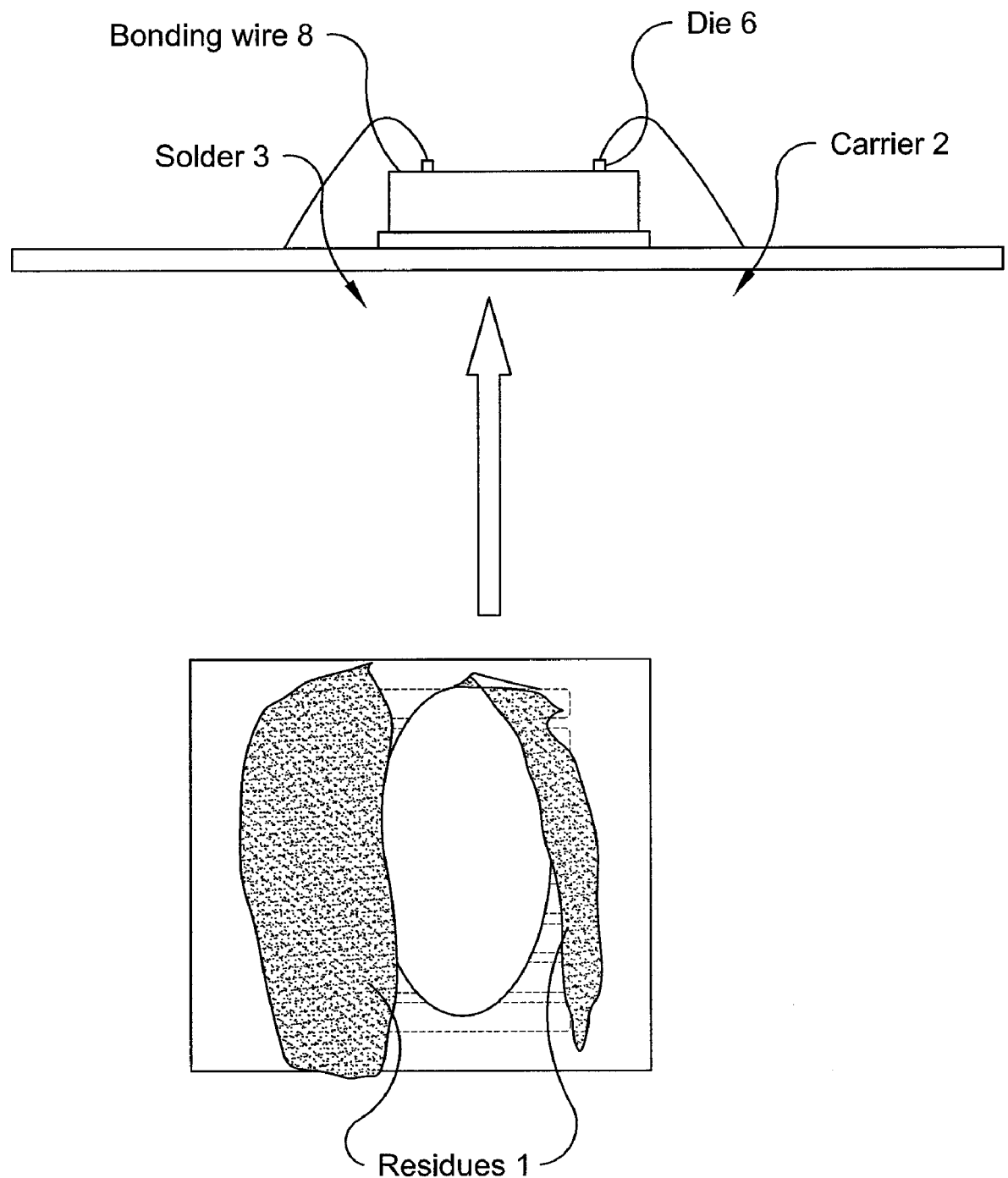
FIG. 4 is a side view of a die-attach schematic, from which the carrier, on which the chip is mounted, is enlarged.

FIG. 4 shows a soldering point 3 underneath a die (non-housed active electrical component) 6, whose location is indicated by the arrow. The soldering point 3 is contaminated by fluxing agent residue 1 and first must be cleaned for bonding purposes. By the use of pastes according to embodiments of the invention, the contamination can be essentially stopped, so that cleaning is unnecessary. This allows an enormous simplification of the method. The expense arising up until now for cleaning caused higher costs than expended for the solder paste.

Figure 5:
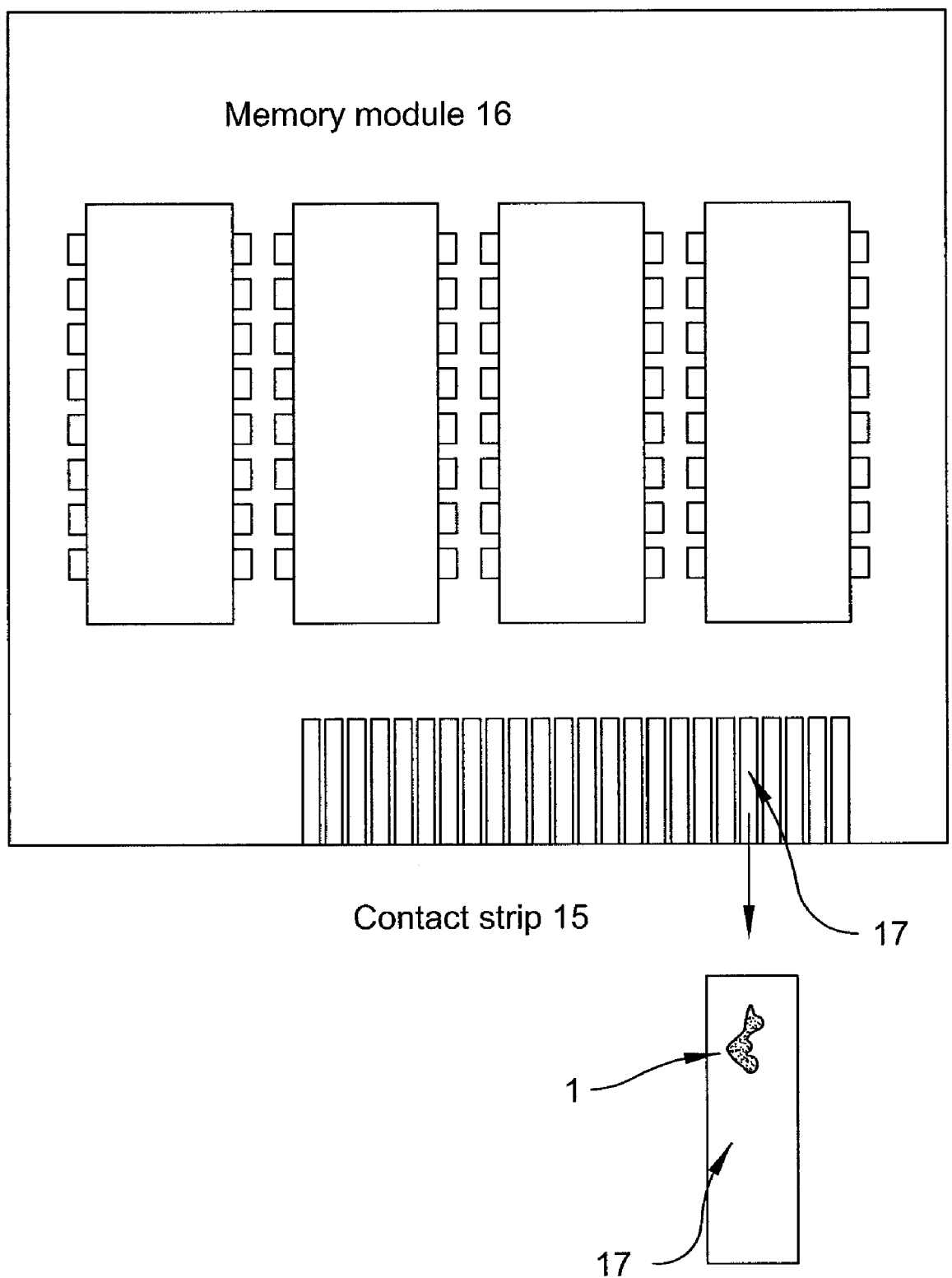
FIG. 5 is a plan view of a memory card, from which a part of the contact strip is enlarged.

FIG. 5 shows the increase in a contact surface 17 from a contact strip 15 of a memory module 16. During soldering of components on the printed circuit board, fluxing agent is sprayed up to the strip 15 and contaminates the contact surfaces 17. This leads to an inadequate contact when the module is plugged into the main circuit board. According to embodiments of the invention, even when the fluxing agent is sprayed, no residue is detected on the contacts, because the fluxing agent according to embodiments of the invention decomposes leaving almost no residue. In this way, the efficiency in the production of memory modules is considerably improved.

Example 7

For the production of a resin-free and lead-free soft solder paste, a gel is prepared as a fluxing agent. For the production of the gel, 53 wt. % tridecyl alcohol, 14 wt. % terpineol, 10 wt. % of a tertiary $C_{12}$ alkyl amine fraction, 20 wt. % sebacic acid, and 3% ricinoleic ester are stirred at room temperature until a gel-like state is reached. This gel is mixed in the weight ratio 8.5:91.5 with a (SA4C0.5) tin-silver-copper soft solder powder (95.5 wt. % tin, 4 wt. % silver, 0.5 wt. % copper) of the type class 5 (15-25 µm).

A paste composed in this way is deposited on a wafer with photoresist using a doctor blade made of hard rubber on the UBM's of the wafer. Alternatively, an application by a template or screen onto the UBM's of a wafer is suitable. After the remelting of the soft solder paste deposited on the UBM's, the wafer is analyzed with reference to the pore formation (voids) of the bumps and the co-planarity with respect to the bump heights. The measurement results of the void analysis are summarized in Table 1. The wafer was divided into 9 regions of 380 bumps each and evaluated. The maximum voids equaled 13.6 vol. %, that is, significantly below 15 vol. %. The maximum standard deviation equaled 2.54 and thus confirmed the uniform construction of voids with an average value significantly below 5 vol. %. Based on statistical likelihood, the narrow distribution practically rules out voids greater than 20 vol. % and even more so voids greater than 30 vol. %.

Comparison Example 1

Figure 9:
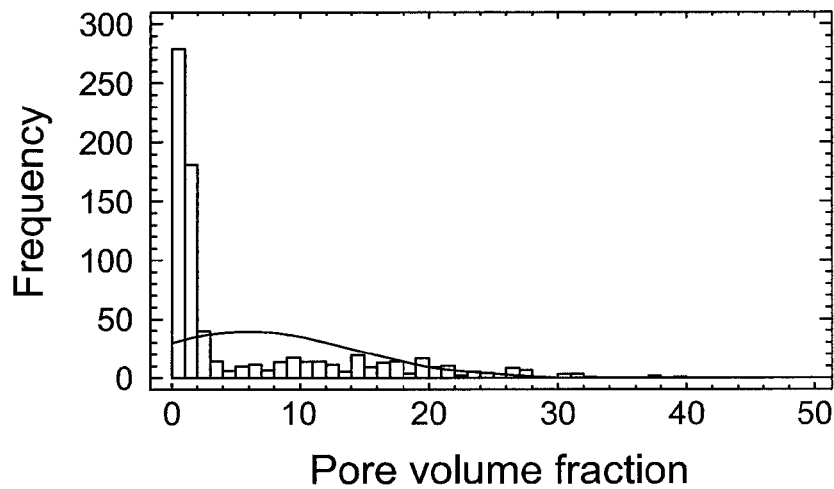
FIG. 9 is a histogram, similar to FIG. 6, plotting the results according to Table 2.
Figure 10:
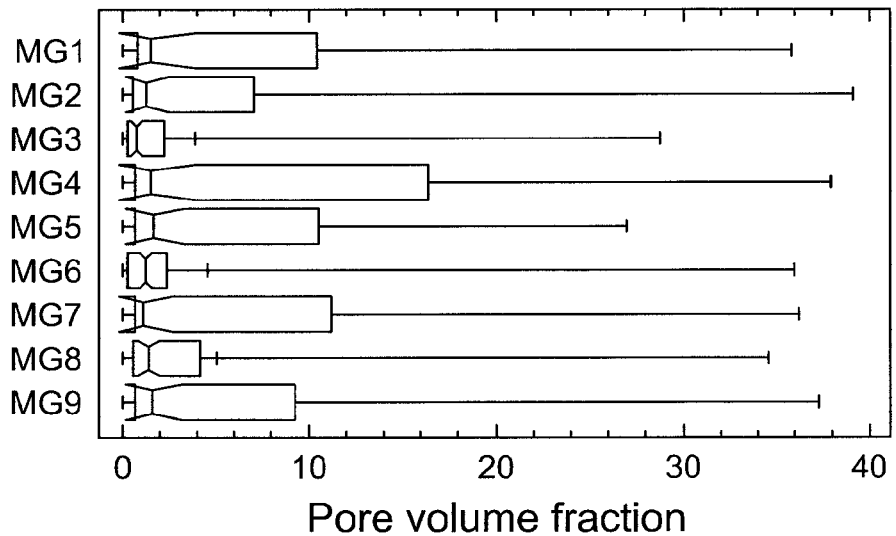
FIG. 10 is a box-and-whisker plot, similar to FIG. 8, of the results according to Table 2.

For comparison, a wafer with conventional paste, i.e., with a fluxing agent based on colophonium and 89 wt. % soft solder paste was produced. The results achieved in this way can be taken from Table 2. FIGS. 9 and 10 illustrate these results. An application with 90 wt. % soft solder proportion in the paste could no longer be applied on the photoresist using the doctor blade, because the viscosity of the paste was too high.

Comparison Example 2

Figure 11:
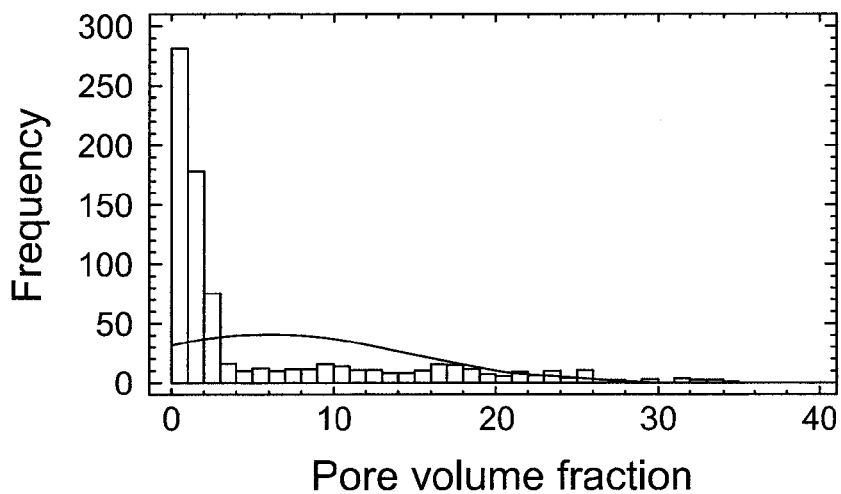
FIG. 11 is a histogram, similar to FIG. 6, plotting the results according to Table 3.
Figure 12:
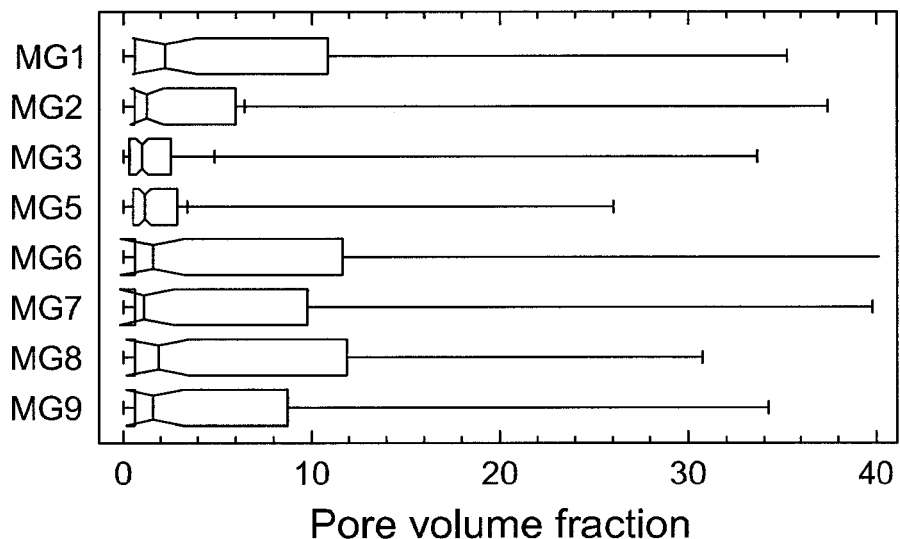
FIG. 12 is a box-and-whisker plot, similar to FIG. 8, of the results according to Table 3.

In another comparison example, the soft solder proportion of paste with colophonium-based fluxing agent equaled 88 wt. %. The corresponding results are summarized in Table 3. FIGS. 11 and 12 illustrate these results.

Figure 6:
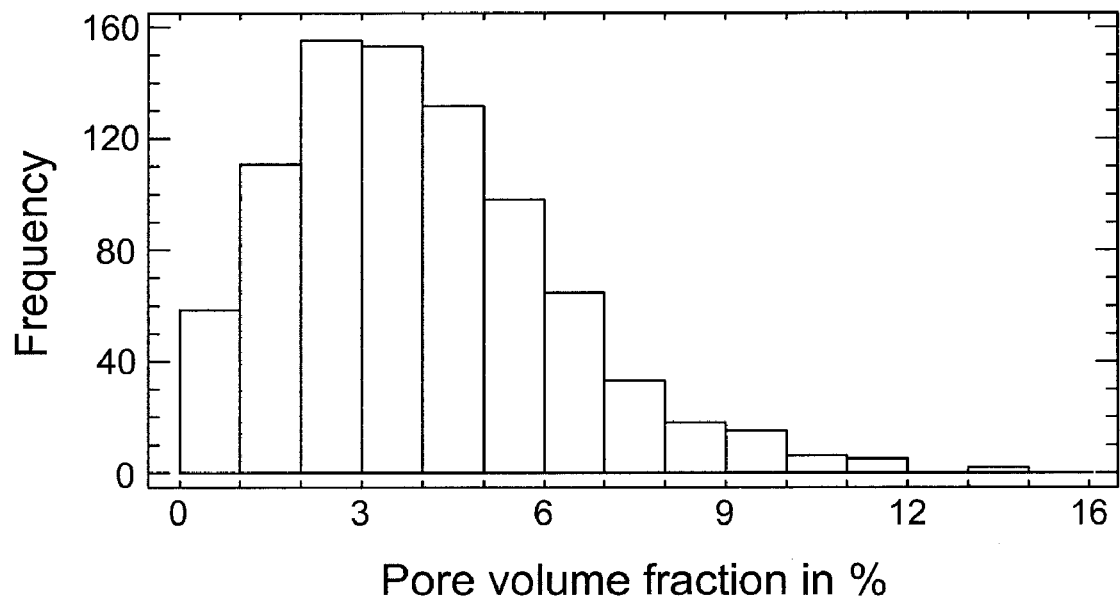
FIG. 6 is a histogram of a wafer after the remelting of the soft solder paste deposited between photoresist on UBM's according to Table 1.

FIGS. 6, 9, and 11 show the frequency of the void classes with a width of 1 vol. %. The application according to the invention according to FIGS. 1 and 6 shows a compact maximum around the classes 2 to 3 and 3 to 4 vol. %, which document a strong drop relative to classes 5 to 6 or 6 to 7 and even more so 7 to 8 vol. %. The proportion above 10 vol. % is already extremely small and limited to less than 15 vol. %. In contrast, Comparison Example 1 according to FIG. 9 shows a maximum of voids for the classes 0 to 1 and 1 to 2 vol. % and the void class 3 to 4 vol. % drops to very small values, which, however, drop only slightly up to class 28 to 29 vol. %. Extremely problematic are the still remaining voids in the classes with greater than 30 vol. %. Comparison Example 2 shows, in FIG. 11, a similar comparison like Comparison Example 1 in FIG. 9.

Figure 7:
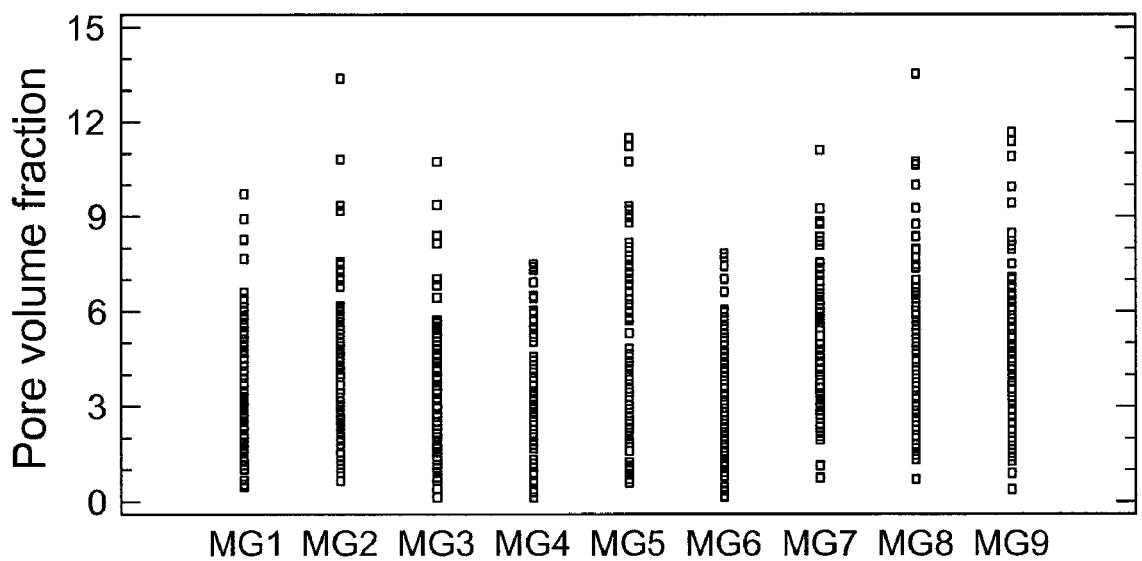
FIG. 7 is an alternative diagram of the results from Table 1 as a scatter plot.

The scatter plot from FIG. 7 illustrates the results according to the invention from Table 1 through the frequency of all 380 measurement points in the measurement groups 1 to 9 of the wafer. Here it is seen that the void formation thins out significantly between 6 and 10 vol. %, and only individual outliers occur between 10 and 15 vol. %. This shows that voids according to the invention are practically ruled out above 15 vol. % and that, even more so, voids above 20 vol. % do not have to be taken into account and definitely not voids above 25 vol. %.

Figure 8:
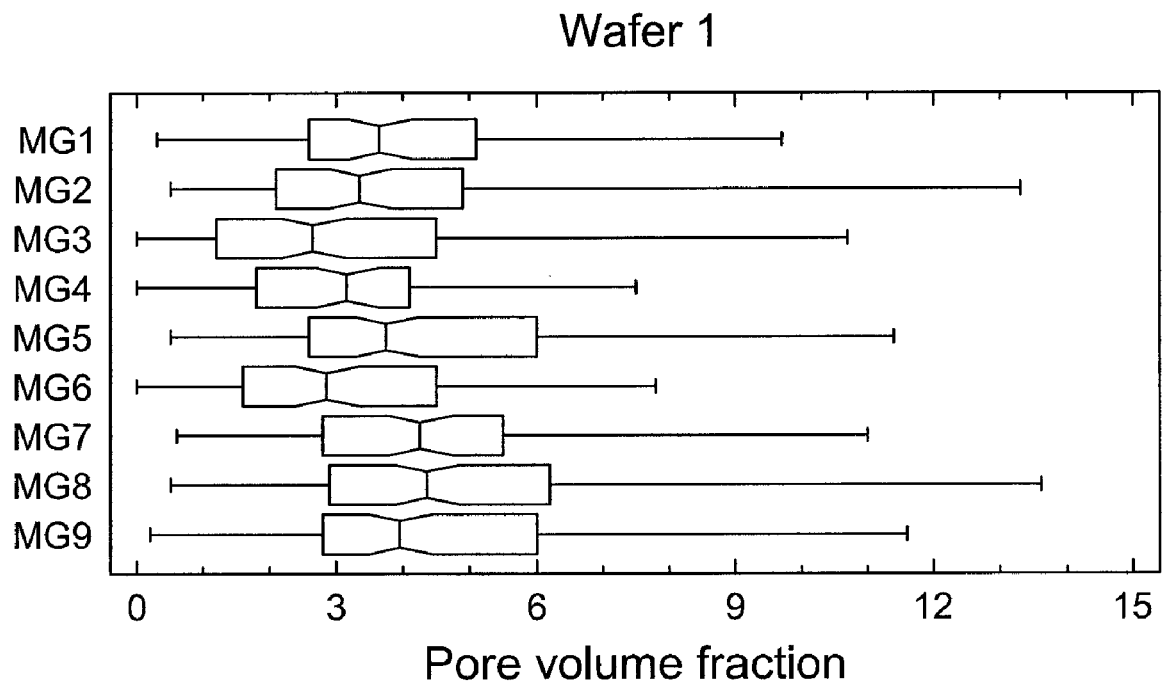
FIG. 8 is a further alternative diagram of the results from Table 1 as a box-and-whisker plot.

In the box-and-whisker plot according to FIGS. 8, 10, and 12, the range of the voids is illustrated by the line for each measurement group. The cross shows the average value. The notch indicates the median, i.e., the middle value of the measured values. The bars show the standard deviation sigma of the median value in the two measurement value directions.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A storage-stable gel containing at least one thermally easily removable carboxylic acid component, at least one thermally easily removable tertiary amine component, and at least one polar solvent, wherein the storage-stable gel is a gelled solution and is resin-free, and wherein the storage-stable gel comprises no reaction products of the carboxylic acid component with the amine component.

2. The gel according to claim 1, wherein the at least one polar solvent has hydrogen bridge generators.

3. A method for production of a gelled solution, the method comprising gelling with each other at least one thermally easily removable carboxylic acid component, at least one thermally easily removable tertiary amine component, and at least one polar solvent component, and wherein the gelled solution is resin-free and comprises no reaction products of the carboxylic acid component with the amine component.

4. The method for production of a gelled solution according to claim 3, further comprising dispersing the gelled solution with a solid powder.

5. A solder paste comprising a metal powder and a gel, wherein the gel is a gelled solution containing at least one thermally easily removable carboxylic acid component, at least one thermally easily removable tertiary amine component, and at least one polar solvent, and wherein the gelled solution is resin-free and comprises no reaction products of the carboxylic acid component with the amine component.

6. The solder paste according to claim 5, wherein the solder paste contains a dye.

7. The solder paste according to claim 6, wherein the dye is present in the paste in an amount of less than 1 wt. %.

8. A method for soldering components comprising remelting a solder paste for attachment of a component, wherein the solder paste comprises a metal powder and a gel, and wherein the gel is a gelled solution containing at least one thermally easily removable carboxylic acid component, at least one thermally easily removable tertiary amine component, and at least one polar solvent, and wherein the gelled solution is resin-free and comprises no reaction products of the carboxylic acid component with the amine component.

9. The method according to claim 8, further comprising subsequently bonding the component without further cleaning of bonding surfaces.

10. The method according to claim 8, wherein the paste is applied for one of the following applications: power-modules, die-attach, chip-on-board, system-in-package (SiP), wafer-bumping, UBM's (Under-Bump-Metallization), SMT (Surface Mounted Technology), and coated circuits.

11. The method according to claim 10, wherein the solder paste is a resin-free paste, and the application comprises construction of electrical connections, which are coated with polymers after soldering without a subsequent treatment for removing fluxing agent residue.

12. The method according to claim 11, wherein the construction comprises formation of solder bumps on wafers, and wherein formation of pores is achieved on less than 20 vol. % of a bump volume with the resin-free solder paste.

* * * * *